(12) United States Patent
Kachatryan et al.

(10) Patent No.: US 9,748,521 B2
(45) Date of Patent: Aug. 29, 2017

(54) METHOD OF MANUFACTURING FLEXIBLE DISPLAY

(71) Applicant: Samsung Display Co., Ltd., Yongin, Gyeonggi-do (KR)

(72) Inventors: Hayk Kachatryan, Yongin (KR); Hyunwoo Koo, Yongin (KR); Taewoong Kim, Yongin (KR); Sunho Kim, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 14/720,197

(22) Filed: May 22, 2015

(65) Prior Publication Data

US 2016/0111683 A1 Apr. 21, 2016

(30) Foreign Application Priority Data

Oct. 17, 2014 (KR) .................... 10-2014-0141196

(51) Int. Cl.
*H01L 51/52* (2006.01)
*H01L 51/00* (2006.01)
(Continued)

(52) U.S. Cl.
CPC ........ *H01L 51/5256* (2013.01); *H01L 51/003* (2013.01); *H01L 51/0097* (2013.01);
(Continued)

(58) Field of Classification Search
CPC ... H01L 51/0097; H01L 51/003; H01L 51/56; H01L 51/5256
See application file for complete search history.

(56) References Cited

U.S. PATENT DOCUMENTS

| 5,232,860 A | 8/1993 | Kawanishi et al. |
| 5,262,347 A | 11/1993 | Sands |

(Continued)

FOREIGN PATENT DOCUMENTS

| JP | 2011-142332 A | 7/2011 |
| JP | 2013-153177 A | 8/2013 |

(Continued)

OTHER PUBLICATIONS

Dang et al., Kinetics and mechanism of hydrogen reduction of $MoO_3$ to $MoO_2$, *Int. Journal of Refractory Metals and Hard Materials* 41 (2013) pp. 216-223.

(Continued)

*Primary Examiner* — Kyoung Lee
*Assistant Examiner* — Christina Sylvia
(74) *Attorney, Agent, or Firm* — Knobbe Martens Olson & Bear LLP

(57) ABSTRACT

A flexible display and method of manufacturing the same are disclosed. In one aspect, the method includes forming a metal peroxide layer over a supporting substrate, forming a metal layer over the metal peroxide layer and forming a flexible substrate over the metal layer. The method also includes forming a display layer over the flexible substrate, irradiating the supporting substrate with laser light in a direction from the supporting substrate to the flexible substrate so as to form a metal oxide layer and separating the supporting substrate from the flexible substrate with the metal oxide layer as a boundary between the supporting substrate and the flexible substrate.

8 Claims, 2 Drawing Sheets

(51) Int. Cl.
*H01L 51/56* (2006.01)
*H01L 27/32* (2006.01)

(52) U.S. Cl.
CPC .......... *H01L 51/56* (2013.01); *H01L 27/3244* (2013.01); *H01L 2227/326* (2013.01); *H01L 2251/5338* (2013.01); *Y02E 10/549* (2013.01)

(56) References Cited

U.S. PATENT DOCUMENTS

| | | | |
|---|---|---|---|
| 6,071,795 | A | 6/2000 | Cheung et al. |
| 7,842,547 | B2 | 11/2010 | Shelton et al. |
| 7,923,348 | B2 | 4/2011 | Yamazaki et al. |
| 2004/0232413 | A1* | 11/2004 | Yamazaki ............ H01L 27/1214 257/43 |
| 2005/0112805 | A1* | 5/2005 | Goto ................... H01L 27/1214 438/149 |
| 2005/0234178 | A1* | 10/2005 | Andrews ................. C01B 15/04 524/439 |
| 2006/0180197 | A1* | 8/2006 | Gui ....................... H01G 9/2031 136/255 |
| 2008/0113460 | A1 | 5/2008 | Shelton et al. |
| 2010/0181903 | A1* | 7/2010 | Kim .................... H01L 51/5256 313/504 |
| 2011/0005587 | A1* | 1/2011 | Auvray ............. H01L 31/03923 136/256 |
| 2011/0052836 | A1 | 3/2011 | Kim et al. |
| 2011/0120755 | A1* | 5/2011 | Lee .................... H01L 27/1214 174/254 |

FOREIGN PATENT DOCUMENTS

| | | | |
|---|---|---|---|
| JP | 2013153177 A | * 8/2013 | ......... H01L 27/1214 |
| KR | 10-2011-0023138 A | 3/2011 | |
| KR | 10-2013-0021566 A | 3/2013 | |

OTHER PUBLICATIONS

Doany et al., "Laser release process to obtain freestanding multilayer metal-polyimide circuits," *IBM J. Res. Develop.* vol. 41 No. 1/2 Jan./Mar. 1997, pp. 151-157.

*Flexible flat panel displays*, Edited by G.P. Crawford, *Wiley-SDI Series in Display Technology*, © 2005 John Wiley & Sons, Ltd, 55 pages.

Gleskova et al., "a-Si:H TFTs Made on Polyimide Foil by PE-CVD at 150° C.," *Mat. Res. Soc. Symp. Proc.* vol. 508 © 1998 Materials Research Society, pp. 73-78.

Perlin et al., "Reduction of the energy gap pressure coefficient of GaN due to the constraining presence of the sapphire substrate," *Journal of Applied Physics*, vol. 85, No. 4, Feb. 15, 1999, pp. 2385-2389.

Puligadda et al., "High-Performance Temporary Adhesives for Wafer Bonding Applications," *Mater. Res. Soc. Symp. Proc.* vol. 970 © 2007, paper No. 0970-704-09, 18 pages.

Yao et al., "Thermal Stability of $Li_2O_2$ and $Li_2O$ for Li-Air Batteries: In Situ XRD and XPS Studies," *J. Electrochem. Soc.* 2013 vol. 160, Issue 6, A824-A831.

\* cited by examiner

METHOD OF MANUFACTURING FLEXIBLE DISPLAY

INCORPORATION BY REFERENCE TO ANY PRIORITY APPLICATIONS

This application claims the benefit of Korean Patent Application No. 10-2014-0141196, filed on Oct. 17, 2014, in the Korean Intellectual Property Office, the disclosure of which is incorporated herein in its entirety by reference.

BACKGROUND

Field

The described technology generally relates to a flexible display and a method of manufacturing the same, and more particularly, to a flexible display having a flexible substrate that is easily detachable from a supporting substrate and a method of manufacturing the flexible display.

Description of the Related Technology

Organic light-emitting diode (OLED) displays are being noted as next-generation displays due to their associated advantages such as wide viewing angles, excellent contrast, and fast response times.

In general, an OLED display has thin film transistors and OLEDs formed on a substrate and the OLEDs display images by emitting light. OLED displays can be used as the display of portable devices such as cell phones and can also be used as the display of large-sized products such as televisions.

SUMMARY OF CERTAIN INVENTIVE ASPECTS

One inventive aspect is a flexible display having a flexible substrate easily detachable from a supporting substrate.

Another aspect is a method of manufacturing the flexible display having a flexible substrate easily detachable from a supporting substrate.

Additional aspects will be set forth in part in the description which follows and, in part, will be apparent from the description, or may be learned by practice of the presented embodiments.

Another aspect is a method of manufacturing a flexible display including forming a metal peroxide layer on a supporting substrate; forming a metal layer on the metal peroxide layer; forming a flexible substrate on the metal layer; forming a display layer on the flexible substrate; irradiating laser light in a direction from the supporting substrate to the flexible substrate, thereby forming a metal oxide layer; and separating the supporting substrate and the flexible substrate with the metal oxide layer as a boundary between the supporting substrate and the flexible substrate.

The forming of the metal peroxide layer may be forming the metal peroxide layer including an alkali metal.

The forming of the metal oxide layer may include: irradiating the laser light on the supporting substrate in the direction from the supporting substrate to the flexible substrate; and as oxygen spreads from the metal peroxide layer to the metal layer by heat of the laser, combining the spread oxygen with the metal layer.

The irradiating of the laser and the combining of the oxygen with the metal layer may be performed simultaneously.

The separating of the supporting substrate and the flexible substrate may be separating the supporting substrate and the flexible substrate such that at least a portion of the metal oxide layer remains on one side of the flexible substrate.

The method may further include forming a barrier layer between the forming of the metal layer and the forming of the flexible substrate.

The forming of the display layer may be forming the display layer including a thin film transistor and an organic light-emitting device electrically connected to the thin film transistor.

The method may further include forming an encapsulation layer formed such that an organic film and an inorganic film are alternated on the display layer.

Another aspect is a flexible display includes a flexible substrate; a metal oxide layer formed on at least a portion of one side of the flexible substrate; a display layer formed on the other side of the flexible substrate; and a barrier layer formed between the flexible substrate and the metal oxide layer.

The display layer may include a thin film transistor and an organic light-emitting device electrically connected to the thin film transistor.

The apparatus may further include an encapsulation layer formed such that an organic film and an inorganic film are alternated on the display layer.

Another aspect is a method of manufacturing a flexible display, the method comprising forming a metal peroxide layer over a supporting substrate; forming a metal layer over the metal peroxide layer; forming a flexible substrate over the metal layer; forming a display layer over the flexible substrate; irradiating the supporting substrate with laser light in a direction from the supporting substrate to the flexible substrate so as to form a metal oxide layer; and separating the supporting substrate from the flexible substrate with the metal oxide layer as a boundary between the supporting substrate and the flexible substrate.

In exemplary embodiments, the metal peroxide layer comprises an alkali metal. The irradiating of the supporting substrate can comprise heating the metal peroxide layer with the laser light so as to spread oxygen from the metal peroxide layer to the metal layer and combine the oxygen with the metal layer. The irradiating of the laser light and the combining of the oxygen with the metal layer can be performed simultaneously. The separating of the supporting substrate from the flexible substrate can comprise separating the supporting substrate from the flexible substrate such that at least a portion of the metal oxide layer remains on one side of the flexible substrate.

In exemplary embodiments, the method further comprises forming a barrier layer between the forming of the metal layer and the forming of the flexible substrate. The forming of the display layer can comprise forming a thin film transistor and an organic light-emitting diode (OLED) electrically connected to the thin film transistor. The method can further comprise forming an encapsulation layer comprising an organic film and an inorganic film that are alternated stacked on the display layer.

Another aspect is a flexible display comprising a flexible substrate; a metal oxide layer formed on at least a portion of one side of the flexible substrate; a display layer formed on the other side of the flexible substrate; and a barrier layer interposed between the flexible substrate and the metal oxide layer.

In exemplary embodiments, the display layer comprises a thin film transistor and an organic light-emitting diode (OLED) electrically connected to the thin film transistor. The flexible display can further comprise an encapsulation layer comprising an organic film and an inorganic film that are alternated stacked on the display layer.

These general and specific embodiments may be implemented by using a system, a method, a computer program, or a combination thereof.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF CERTAIN INVENTIVE EMBODIMENTS

Figure 1:
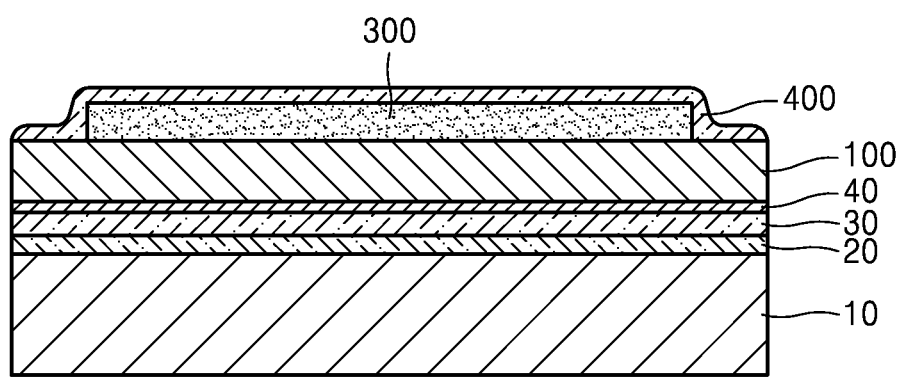
FIGS. 1 through 3 are cross-sectional views schematically illustrating a process of manufacturing a flexible display according to an embodiment.

One type of OLED display, that is flexible displays, are being actively researched. In order to manufacture such a flexible display, instead of using a traditional glass substrate, a flexible substrate formed of a material such as synthetic resin is used. Flexible substrates can have a problem in that it is not easy to handle such substrates in a manufacturing process because of their flexible properties. Accordingly, in order to solve this problem, a flexible substrate can be formed on a supporting substrate having sufficient rigidity, and after several processes, the flexible substrate is separated from the supporting substrate.

These standard flexible displays and methods of manufacturing the same have problems where a material used as a sacrificial layer is relatively expensive and is not easy to handle in a manufacturing process. Further, it is difficult to fix such a flexible substrate onto a supporting substrate because of a weak adhesive strength between the supporting substrate and the flexible substrate.

As the described technology allows for various changes and numerous embodiments, exemplary embodiments will be illustrated in the drawings and described in detail in the written description. The effects and features of the described technology and methods of accomplishing the same will become apparent from the following description of the embodiments in detail, taken in conjunction with the accompanying drawings. The described technology may, however, be embodied in many different forms and should not be construed as limited to the exemplary embodiments set forth herein.

Hereinafter, the described technology will be described in detail with reference to the accompanying drawings, in which exemplary embodiments of the described technology are shown Like reference numerals in the drawings denote like elements, and thus repeated descriptions thereof will be omitted.

While such terms as "first" and "second" may be used to describe various components, such components must not be limited to the above terms. The above terms are used only to distinguish one component from another. Also, the singular forms "a," "an," and "the" are intended to include the plural forms as well, unless the context clearly indicates otherwise.

It will be understood that the terms such as "including," "comprising," and "having" used herein specify the presence of stated features or components, but do not preclude the presence or addition of one or more other features or components. It will be further understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for the sake of clarity. In other words, since the sizes and thicknesses of components in the drawings may be exaggerated, the following embodiments are not limited thereto.

In the following examples, the x-axis, the y-axis and the z-axis are not limited to the three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items.

Figure 2:
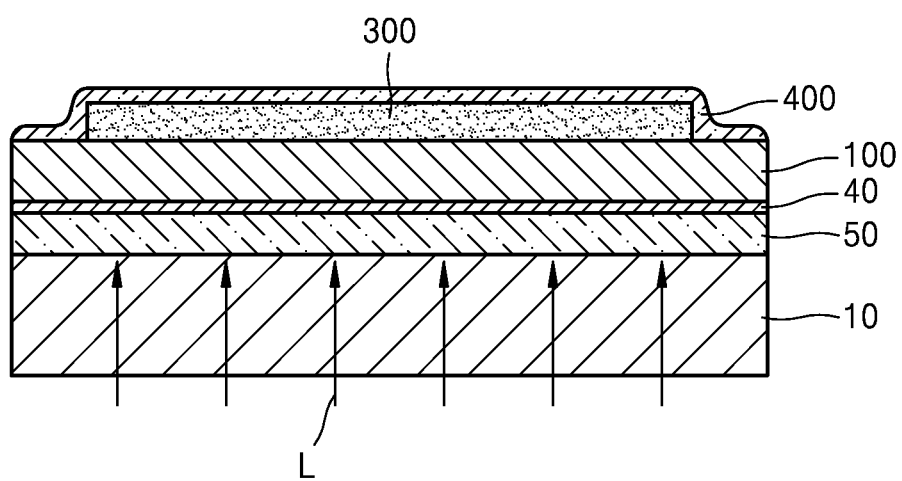
Figure 3:
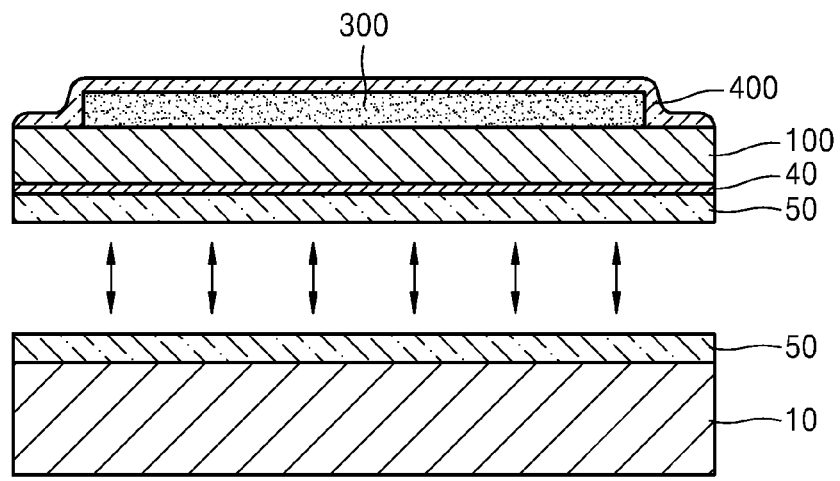

FIGS. 1 through 3 are cross-sectional views schematically illustrating a process of manufacturing a flexible display according to an embodiment.

Referring to FIG. 1, in order to manufacture a flexible display according to an embodiment, a first operation of forming a metal peroxide layer 20 on a supporting substrate 10 is performed. The supporting substrate 10 may be formed of various materials such as glass having sufficient rigidity or a metal material. As a flexible substrate 100 itself has flexible properties, the supporting substrate 10 serves to support the flexible substrate 100 while various kinds of layers which will be described in the following are formed on the flexible substrate 100.

As described above, the metal peroxide layer 20 may be formed on the supporting substrate 10 prior to the flexible substrate 100. The metal peroxide layer 20 may include alkali metals such as lithium (Li), sodium (Na), or potassium (K). Accordingly, the metal peroxide layer 20 may be $Li_2O_2$, $Na_2O_2$, or $K_2O_2$; however, the present embodiment is not limited thereto. The metal peroxide layer 20 can be formed to have a thickness of about 10 nm to about 100 nm, and more particularly, a thickness of about 20 nm to about 50 nm.

Specifically, a method of forming the metal peroxide layer 20 can start from forming a metal film such as an alkali metal film on the supporting substrate 10. The alkali metal film can be formed by using methods such as sputtering, physical vapor deposition (PVD), or chemical vapor deposition (CVD). After the alkali metal film is formed on the supporting substrate 10, the alkali metal film is annealed in an oxygen atmosphere. Through this process, the metal peroxide layer 20 may be formed.

For example, when the alkali metal film is formed by using sodium, the alkali metal film can be annealed at a temperature of about 130° C. to about 200° C. so as to combine with oxygen through the reaction process shown below.

$$4Na + O_2 \rightarrow 2Na_2O$$

$$2Na_2O + O_2 \rightarrow 2Na_2O_2$$

Through the above process, a sodium peroxide layer can be formed. However, the present embodiment is not limited thereto, and a sodium amalgam can also be used to form the sodium peroxide layer. In this case, the sodium peroxide layer can be formed by using a sodium amalgam diluted solution of about 0.1 mol % to about 0.5 mol % at a temperature of about 0° C. to about 20° C.

Next, an operation of forming a metal layer 30 on the metal peroxide layer 20 can be performed. The metal layer 30 may include molybdenum (Mo), iron (Fe), tungsten (W), or chromium (Cr); however, the described technology is not limited thereto. On the metal peroxide layer 20, the metal layer 30 can be formed to have a thickness of about 10 nm to about 100 nm, preferably a thickness of about 20 nm to about 50 nm, and more preferably a thickness of about 15 nm to about 25 nm. The metal layer 30 can be formed on the metal peroxide layer 20 by using methods such as sputtering, PVD, CVD, or electron beam (EB) deposition.

After the metal layer 30 is formed, an operation of forming the flexible substrate 100 on the metal layer 30 can be performed. The flexible substrate 100, which has flexible properties, can be formed of various materials, for example, metal materials, or plastic materials such as polyethylene terephthalate (PET), polyethylene naphthalate (PEN), polyester (PES), polyetheretherketone (PEEK), polycarbonate (PC) or polyimide (PI). Thin metal foil such as steel use stainless (SUS) can also be used as a material of the flexible substrate 100.

In some embodiments, a barrier layer 40 can be further formed between the metal layer 30 and the flexible substrate 100. The barrier layer 40 can prevent impurities from penetrating through the flexible substrate 100. The barrier layer 40 may be formed of an inorganic film and may include silicon oxide (SiOx), silicon nitride (SiNx), silicon oxynitride (SiOxNy), aluminum oxide ($Al_2O_3$), aluminum nitride (AlN), or aluminum oxynitride (AlOxNy).

On the flexible substrate 100, a display layer 300 can be formed. Although not illustrated in FIG. 1, the display layer 300 can include a thin film transistor, and an OLED electrically connected to the thin film transistor. For example, the display layer 300 can be an OLED display layer including a plurality of thin film transistors and pixel electrodes connected thereto. Alternatively, the display layer 300 can be a liquid crystal display layer. A detailed structure of the display layer 300 will be described with reference to FIG. 4.

Meanwhile, on the display layer 300, an encapsulation layer 400 can be formed. The encapsulation layer 400 can be formed on an opposite electrode of the display layer 300 which will be described later and can be formed on the entire surface of the flexible substrate 100. The encapsulation layer 400 covers the display layer 300 and a portion of the encapsulation layer 400 can be in direct contact with an edge of the flexible substrate 100. The encapsulation layer 400 can be formed such that an organic film and an inorganic film are alternately arranged. The encapsulation layer 400 serves to prevent impurities, moisture, or the like from penetrating through the display layer 300 from the environment.

The organic film forming the encapsulation layer 400 may include, for example, one or more materials selected from the group consisting of an acrylic resin, a methacrylic resin, polyisoprene, a vinyl resin, an epoxy resin, a urethane resin, a cellulose resin, and a perylene resin. Also, the inorganic film forming the encapsulation layer 400 may include, for example, one or more materials selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

Referring to FIG. 2, a metal oxide layer 50 can be formed by irradiating laser light L in a direction from the supporting substrate 10 to the flexible substrate 100. In some embodiments, forming the metal oxide layer 50 includes irradiating laser light L on the supporting substrate 10 in the direction from the supporting substrate 10 to the flexible substrate 100. That is, the laser light L is irradiated on one side of the supporting substrate 10 which conducts heat to the metal peroxide layer 20 formed on the other side of the supporting substrate 10. The metal peroxide layer 20 is exposed to high-temperature heat by the irradiated laser light L. In the process, oxygen combined in the metal peroxide layer 20 is separated therefrom and spreads to the metal layer 30. Depending on the thickness of the metal peroxide layer 20, a portion of the metal peroxide layer 20 that is in contact with the flexible substrate 100 may remain unaltered.

For the oxygen combined in the metal peroxide layer 20 to spread well, a temperature of equal to or greater than about 500° C. needs to be applied to the metal peroxide layer 20, and more particularly, a temperature of equal to or greater than 600° C. can be applied. When a temperature of less than about 500° C. is applied, as the oxygen does not sufficiently spread, and thus, the metal layer 30 partially becomes a metal oxide and the rest of the metal layer 30 is unaltered. Thus, it may be not easy to detach the flexible substrate 100 from the supporting substrate 10.

As such, when the oxygen combined in the metal peroxide layer 20 is separated by the laser light L irradiated to the metal peroxide layer 20 and combines with the metal layer 30, the metal layer 30 becomes the metal oxide layer 50. For example, the metal oxide layer 50 may be formed of molybdenum oxide (MoOx), tungsten oxide (WOx), chromium oxide (CrOx), or iron oxide (FeOx) (x=4, 5, 6).

As described above, the operation of irradiating the laser light L and the operation of oxygen combining with the metal layer 30 can be performed simultaneously. Since the laser light L needs to be irradiated onto a sacrificial layer in order to detach the flexible substrate 100 from the supporting substrate 10, the metal layer 30 can be formed as the metal oxide layer 50 by heating the metal layer 30 and the metal peroxide layer 20 with the laser light L, thereby streamlining process operations. Also, when metal oxide is directly formed as a sacrificial layer without going through such an operation, the adhesive strength between the flexible substrate 100 and the supporting substrate 10 is weak, and thus defects such as the flexible substrate 100 falling off of the supporting substrate 10 may occur when handling the flexible substrate 100 during a manufacturing process. On the contrary, in a method of manufacturing a flexible display according to the present embodiment, after the metal peroxide layer 20 is formed on the supporting substrate 10 and the metal layer 30 is formed thereon, the metal layer 30 is formed as the metal oxide layer 50 by the heat of the laser light L irradiated in separating the flexible substrate 100 and the supporting substrate 10. Thus, a process of manufacturing the flexible display can be streamlined and the flexible substrate 100 can also be firmly bonded to the supporting substrate 10 until the flexible substrate 100 is detached from the supporting substrate 10.

Referring to FIG. 3, after the metal oxide layer 50 is formed by irradiating the laser light L, an operation of separating the flexible substrate 100 from the supporting substrate 10 with the metal oxide layer 50 as a boundary between the supporting substrate 10 and the flexible substrate 100 can be performed. On one side of the flexible substrate 100, at least a portion of a second metal oxide may remain. As such, the metal oxide layer 50 remaining on the one side of the flexible substrate 100 may serve as a protection film for protecting a lower portion of the flexible substrate 100.

While a method of manufacturing a flexible display has been mainly described, exemplary embodiments are not limited thereto. For example, a flexible display manufactured by using the method of manufacturing such a flexible display is also within the scope of the described technology.

Figure 4:
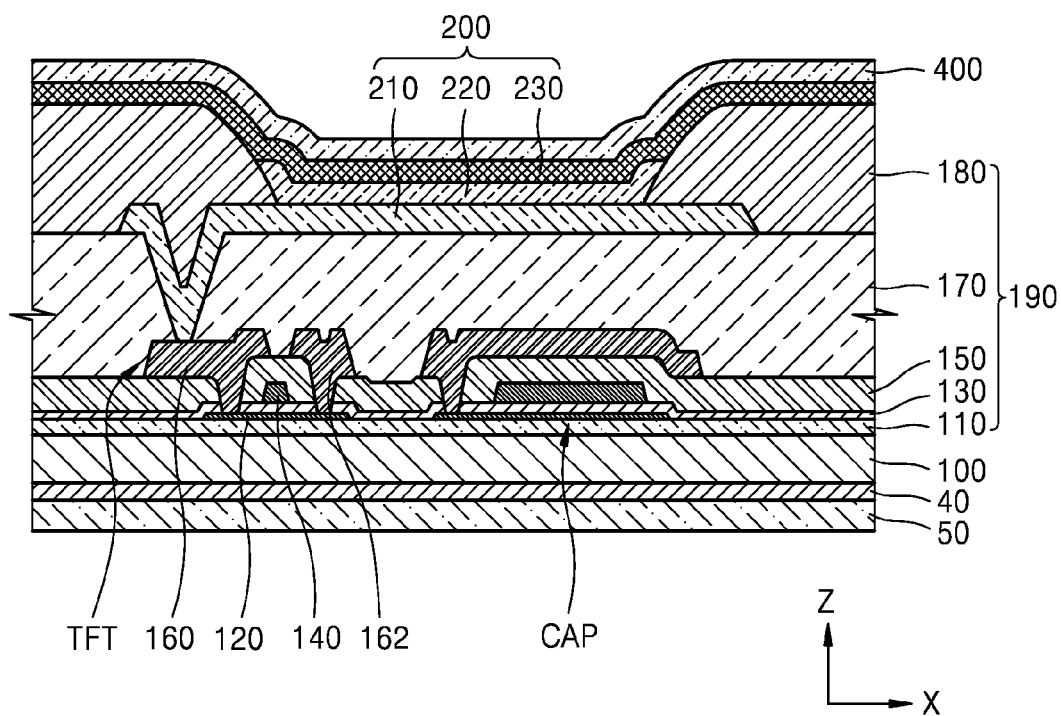
FIG. 4 is a schematic cross-sectional view of a flexible display according to an embodiment.

FIG. 4 is a schematic cross-sectional view of a flexible display manufactured by the manufacturing process of FIGS. 1 through 3.

Referring to FIG. 4, a flexible display includes a flexible substrate 100, a thin film transistor layer 190 and an OLED 200 which are formed on one side of the flexible substrate 100. The flexible display also includes a barrier layer 40 and a metal oxide layer 50 which are formed on the other side of the flexible substrate 100. The display layer 300 described in FIGS. 1 through 3 includes the thin film transistor layer 190 and the OLED 200. Although it is illustrated in FIG. 4 that the OLED 200 is formed on the thin film transistor layer 190, the described technology is not limited thereto. When the flexible display is bottom-emission type display, the OLED 200 can also be formed directly on the flexible substrate 100.

The flexible substrate 100 has flexible properties and can be formed of various materials, for example, metal materials, or plastic materials such as PET, PEN, or polyimide.

A display layer 300 is formed on the flexible substrate 100. In certain embodiments, the display layer 300 includes a thin film transistor TFT and a capacitor CAP and the OLED 200 electrically connected to the thin film transistor TFT. The thin film transistor TFT includes a semiconductor layer 120 including amorphous silicon, polycrystalline silicon, or an organic semiconductor material, a gate electrode 140, a source electrode 160, and a drain electrode 162. Hereinafter, a general structure of the thin film transistor TFT will be described in detail.

First, a buffer layer 110 formed of silicon oxide, silicon nitride, or the like can be formed on the flexible substrate 100 in order to planarize a surface of the flexible substrate 100 or prevent impurities and the like from penetrating through the semiconductor layer 120 of the thin film transistor TFT, and the semiconductor layer 120 can be positioned on the buffer layer 110.

The gate electrode 140 is formed over the semiconductor layer 120, and the source electrode 160 and the drain electrode 162 are electrically connected to each other according to a signal applied to the gate electrode 140. In consideration of the distance to an adjacent layer, the surface flatness of a layer to be stacked, processability, and the like, the gate electrode 140, for example, may be formed of one or more materials from the following: aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu) as a single layer or multiple layers.

A gate insulating film 130 formed of silicon oxide and/or silicon nitride, or the like can be formed between the semiconductor layer 120 and the gate electrode 140 to electrically insulation the semiconductor layer 120 from the gate electrode 140.

An interlayer insulating film 150 can be formed over the gate electrode 140 and the interlayer insulating film 150 can be formed of materials such as silicon oxide or silicon nitride as a single layer or multiple layers.

The source electrode 160 and the drain electrode 162 are formed over the interlayer insulating film 150. The source electrode 160 and the drain electrode 162 are respectively electrically connected to the semiconductor layer 120 via contact holes formed in the interlayer insulating film 150 and the gate insulating film 130. In consideration of conductivity and the like, the source electrode 160 and the drain electrode 162, for example, may be formed of one or more materials from the following: Al, Pt, Pd, Ag, Mg, Au, Ni, Nd, Jr, Cr, Li, Ca, Mo, Ti, W, and Cu as a single layer or multiple layers.

Although not illustrated in FIG. 4, a protection film (not shown) can be formed to cover the thin film transistor TFT for protection of the thin film transistor TFT having the above described structure. The protection film (not shown), for example, may be formed of inorganic materials such as silicon oxide, silicon nitride, or silicon oxynitride.

Meanwhile, a first insulating film 170 can be formed on the flexible substrate 100. The first insulating film 170 can be a planarization film and may also be a protection film. When the OLED 200 is formed over the thin film transistor TFT, the first insulating film 170 serves to substantially planarize an upper surface of the thin film transistor TFT and protect the thin film transistor TFT and different kinds of devices. The first insulating film 170, for example, can be formed of an acrylic organic material, benzocyclobutene (BCB), or the like. As shown in FIG. 4, the buffer layer 110, the gate insulating film 130, the interlayer insulating film 150, and the first insulating film 170 can be formed on the entire surface of the flexible substrate 100.

Meanwhile, a second insulating film 180 can be formed over the thin film transistor TFT. The second insulating film 180 can be a pixel defining layer. The second insulating film 180 can be positioned on the first insulating film 170 and may have an opening. The second insulating film 180 serves to define a pixel region on the flexible substrate 100.

The second insulating film 180, for example, can be provided as an organic insulating film. The organic insulating film can include an acrylic polymer such as poly(methyl methacrylate) (PMMA), polystyrene (PS), a polymer derivative having a phenol group, an imide-based polymer, an aryl ether-based polymer, an amide-based polymer, a fluorine-based polymer, a p-xylene based polymer, a vinyl alcohol-based polymer, and a mixture thereof.

Meanwhile, the OLED 200 can be formed on the second insulating film 180. The OLED 200 can include a pixel electrode 210, an intermediate layer 220 including an emission layer (EML), and an opposite electrode 230.

The pixel electrode 210 can be formed as a (semi)transparent electrode or a reflective electrode. When the pixel electrode 210 is formed as a (semi)transparent electrode, the pixel electrode 210, for example, may be formed of indium tin oxide (TTO), indium zinc oxide (IZO), zinc oxide (ZnO), indium oxide ($In_2O_3$), indium gallium oxide (IGO), or aluminum zinc oxide (AZO). When the pixel electrode 210 is formed as a reflective electrode, the pixel electrode 210 may have a reflective film formed of Ag, Mg, Al, Pt, Pd, Au, Ni, Nd, Jr, Cr, a compound thereof and the like, and a layer formed of ITO, IZO, ZnO, $In_2O_3$, IGO, or AZO. However, the described technology is not limited thereto. The pixel electrode 210 can be formed of various materials, and the structure of the pixel electrode 210 may have various modifications such as a single layer or multiple layers.

The intermediate layer 220 can be formed in the pixel region defined by the second insulating film 180. The intermediate layer 220 includes the EML that can emit light based on an electrical signal. The intermediate layer can also include a hole injection layer (HIL) and a hole transport layer (HTL) which are formed between the EML and the pixel electrode 210, and an electron transport layer and an electron injection layer which are formed between the EML and the opposite electrode 230 as a single or complex structure. However, the intermediate layer 220 is not limited thereto and may have various structures.

The opposite electrode 230 facing the pixel electrode 210 while covering the intermediate layer 220 which includes the EML can be formed over the entire surface of the flexible substrate 100. The opposite electrode 230 can be formed as a (semi)transparent electrode or a reflective electrode.

When the opposite electrode 230 is formed as a (semi) transparent electrode, the opposite electrode 230 may have a layer formed of Li, Ca, LiF/Ca, LiF/Al, Al, Ag, and Mg, which are metals having a low work function, and a compound thereof and may have a (semi)transparent conductive layer formed of ITO, IZO, ZnO, $In_2O_3$, or the like. When the opposite electrode 230 is formed as a reflective electrode, the opposite electrode 230 can have a layer formed of Li, Ca, LiF/Ca, LiF/Al, Al, Ag, Mg, and a compound thereof. However, the structure and the material of the opposite electrode 230 are not limited thereto and may have various modifications.

An encapsulation layer 400 can be formed on the display layer 300. The encapsulation layer 400 can be formed on the opposite electrode 230 and can be formed over the entire surface of the flexible substrate 100. The encapsulation layer 400 covers the display layer 300 and a portion of the encapsulation layer 400 can be in direct contact with an edge of the flexible substrate 100. The encapsulation layer 400 can be formed to include an organic film and an inorganic film that are alternately stacked. The encapsulation layer 400 serves to prevent impurities, moisture, or the like from penetrating through the display layer 300 from the environment.

Additionally, the barrier layer 40 and the metal oxide layer 50 are formed on a lower surface of the flexible substrate 100. That is, it can be understood that the metal oxide layer 50 is formed on the lower surface of the flexible substrate 100 and the barrier layer 40 is formed between the flexible substrate 100 and the metal oxide layer 50.

The barrier layer 40 can prevent impurities from penetrating through the flexible substrate 100. The barrier layer 40 may be formed of an inorganic film and may include, for example, SiOx, SiNx, SiOxNy, $Al_2O_3$, AlN, or AlOxNy.

As described above, as oxygen which is separated from a metal peroxide layer 20 formed under a metal layer 30 spreads to the metal layer 30, the metal oxide layer 50 can be formed. The metal oxide layer 50, for example, may be formed of MoOx, WOx, CrOx, or FeOx (x=4, 5, 6); however, the metal oxide layer 50 is not limited thereto.

In at least one embodiment, since a laser light L needs to be irradiated to a sacrificial layer in order to detach the flexible substrate 100 from a supporting substrate 10 in the manufacturing process, the metal layer 30 can be formed as the metal oxide layer 50 by heat of the laser light L, thereby streamlining process operations. Also, when metal oxide is directly formed as a sacrificial layer without going through such an operation, the adhesive strength between the flexible substrate 100 and the supporting substrate 10 is weak, and thus defects such as the flexible substrate 100 falling off of the supporting substrate 10 may occur when handling the flexible substrate 100 during the manufacturing process. On the contrary, according to the method of manufacturing the flexible display according to at least one embodiment, after the metal peroxide layer 20 is formed on the supporting substrate 10 and the metal layer 30 is formed thereon, the metal oxide layer 50 is formed by the heat of the laser light L irradiated in separating the flexible substrate 100 and the supporting substrate 10. Thus, the manufacturing process can be streamlined and the flexible substrate 100 can also be firmly bonded to the supporting substrate 10 until the flexible substrate 100 is detached from the supporting substrate 10.

As described above, according to one or more of the above exemplary embodiments, a flexible display having a flexible substrate easily detachable from a supporting substrate and a method of manufacturing the flexible display are disclosed. However, no limitation of the scope of the described technology is intended by such an effect.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a flexible display, the method comprising:
    forming a metal peroxide layer over a supporting substrate;
    forming a metal layer over the metal peroxide layer;
    forming a flexible substrate over the metal layer;
    forming a display layer over the flexible substrate;
    irradiating the supporting substrate with laser light in a direction from the supporting substrate to the flexible substrate so as to form a metal oxide layer; and
    separating the supporting substrate from the flexible substrate with the metal oxide layer as a boundary between the supporting substrate and the flexible substrate.

2. The method of claim 1, wherein the metal peroxide layer comprises an alkali metal.

3. The method of claim 1, wherein the irradiating of the supporting substrate comprises heating the metal peroxide layer with the laser light so as to spread oxygen from the metal peroxide layer to the metal layer and combine the oxygen with the metal layer.

4. The method of claim 3, wherein the irradiating of the laser light and the combining of the oxygen with the metal layer are performed simultaneously.

5. The method of claim 1, wherein the separating of the supporting substrate from the flexible substrate comprises separating the supporting substrate from the flexible substrate such that at least a portion of the metal oxide layer remains on one side of the flexible substrate.

6. The method of claim 1, further comprising forming a barrier layer between the forming of the metal layer and the forming of the flexible substrate.

7. The method of claim 1, wherein the forming of the display layer comprises forming a thin film transistor and an organic light-emitting diode (OLED) electrically connected to the thin film transistor.

8. The method of claim 1, further comprising forming an encapsulation layer comprising an organic film and an inorganic film that are alternated stacked on the display layer.

* * * * *